United States Patent [19]

Wong

[11] Patent Number: 5,376,904
[45] Date of Patent: Dec. 27, 1994

[54] DIRECTIONAL COUPLER FOR DIFFERENTIALLY DRIVEN TWISTED LINE

[75] Inventor: Larry K. Wong, Kanata, Canada

[73] Assignee: Northern Telecom Limited, Montreal, Canada

[21] Appl. No.: 64,283

[22] Filed: May 20, 1993

[51] Int. Cl.⁵ .............................. H01P 5/18
[52] U.S. Cl. .................. 333/1; 333/116; 370/85.1
[58] Field of Search ........... 333/109, 116; 307/89; 320/85.1

[56] References Cited

U.S. PATENT DOCUMENTS

| | | | |
|---|---|---|---|
| 3,619,504 | 11/1971 | Olney et al. | 178/68 |
| 3,748,601 | 7/1973 | Seidel | 333/109 |
| 4,423,392 | 12/1983 | Woltson | 333/116 |

FOREIGN PATENT DOCUMENTS

| | | | |
|---|---|---|---|
| 0006058 | 6/1977 | Japan . | |
| 3283701 | 12/1991 | Japan | 333/109 |

OTHER PUBLICATIONS

"Meander-Folded Coupled Lines" *IEEE Transactions on Microwave Theory and Techniques* vol. MTT-26 No. 4 Apr. 1978 pp. 225-231.

*Primary Examiner*—Robert J. Pascal
*Assistant Examiner*—Darius Gambino
*Attorney, Agent, or Firm*—Dallas F. Smith

[57] ABSTRACT

An interface for differentially driven twisted pair cable provides for inductive and capacitive coupling of a differential drive signal to respective conductors of the twisted pair. Two input tracks have a terminating resistor at a far end whose value equals the characteristic impedance of the respective track. An output track having two branches provides connection at the near end to the twisted pair cable, the far ends being connected by a terminating resistor whose value is equal to the impedance of the twisted pair cable. The output branches parallel the input tracks for a coupling length $L_C$.

5 Claims, 2 Drawing Sheets

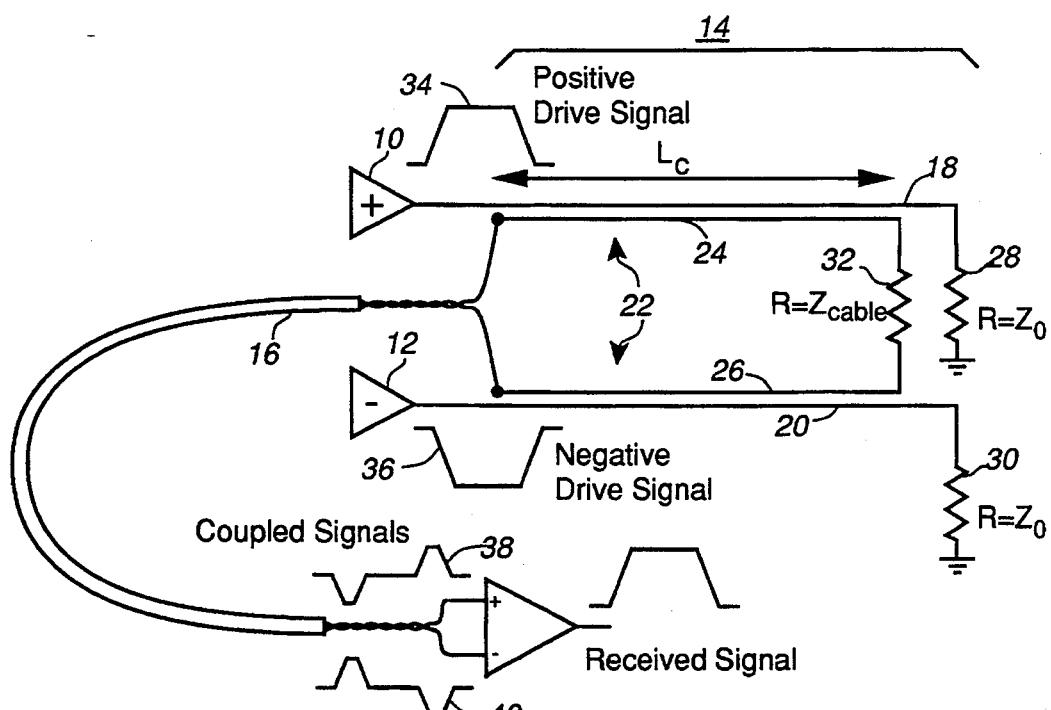
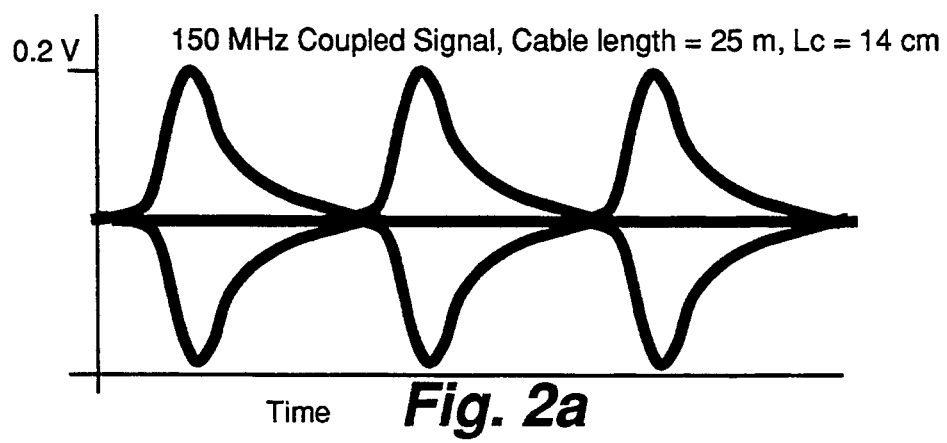
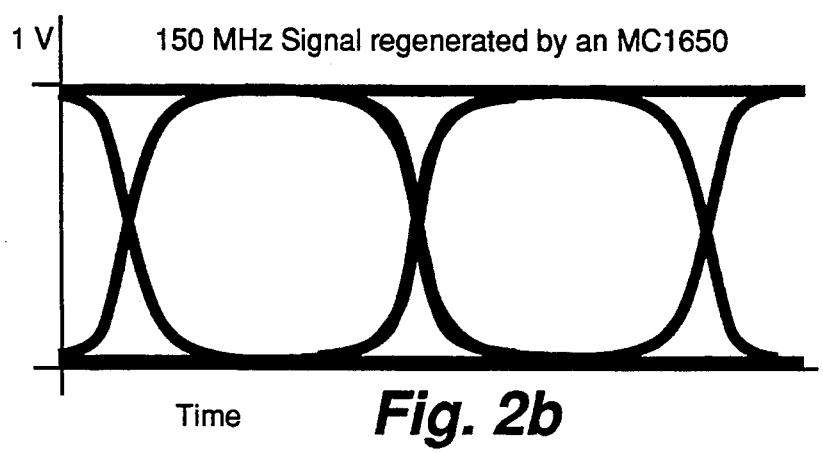
Fig. 1
Fig. 2a
Fig. 2b ial 150 MHz NRZ random data signal coupled onto a 25 m unshielded twisted pair cable results in a typical coupled signal of FIG. 2a. Recovering a differential NRZ signal from the twisted pair cable using a comparator provides a typical regenerated differential signal of

DIRECTIONAL COUPLER FOR DIFFERENTIALLY DRIVEN TWISTED LINE

This invention relates to twisted pair transmission and is particularly concerned with differential driving.

BACKGROUND OF THE INVENTION

Several proposed and adopted transmission applications require high bandwidth. Examples include 155 Mbit/s ATM-1 and 125 Mbit/s FDDI. At these transmission rates, the generation of electromagnetic interference (EMI) at physical interfaces, for example connectors and from the transmission cable become problematic. This problem is of increasing concern as regulatory agencies draft and impose rules limiting the level of allowable emission. Because of EMI problems, shielded coaxial cable has been the traditional medium for high-speed rates of single-ended transmission and shielded twisted pair cable has been the traditional medium for high-speed rates of differential transmission. EMI radiation is suppressed by using a very high performance balun and a high performance common-mode choke to achieve balanced differential transmission. However, at rates greater than 100 Mbit/s, baluns may not be sufficiently balanced to suppress the generation of EMI, may be too bulky to be installed on printed circuit boards, or may not have sufficient bandwidth.

SUMMARY OF THE INVENTION

An object of the present invention is to provide improved twisted pair transmission.

In accordance with an aspect of the present invention there is provided an interface for differentially driven twisted pair transmission comprising: a first track having an input at one end and a first termination resistor at the other; a second track having an input at one end and a second termination resistor at the other; and a third track having a first branch substantially parallel to the first track and a second branch substantially parallel to the second track; the first branch having an output at a near end adjacent to the input of the first track; the second branch having an output at a near end adjacent to the input of the second track; first and second branches having far ends connected via a third termination resistor.

In an embodiment of the present invention the first track and first branch and the second track and second branch are formed in a u-shape.

In a further embodiment of the present invention each track and branches are formed as a series of continuous u-shapes within a rectangular area of a printed circuit board.

In accordance with another aspect of the present invention there is provided an interface for differentially driven twisted pair transmission comprising: a first stripline having an input at one end and a first termination resistor at the other; a second stripline having an input at one end and a second termination resistor at the other; and a third stripline having a first branch substantially parallel to the first stripline and a second branch substantially parallel to the second stripline; the first branch having an output at a near end adjacent to the input of the first stripline; the second branch having an output at a near end adjacent to the input of the second stripline; first and second branches effectively terminated by an impedance substantially equivalent to a characteristic impedance of twisted pair cable.

Advantages of the present invention are a capability to transmit signals at speeds between 1 kbit/s to 300 Mbit/s, a coupling structure implementable on printed circuit boards, simple recovery of coupled signal, a coupled signal with no DC component, a lower level of radiated emission for coupled signal, simple matching of cable impedance by adjusting track width, and applicability to 155 Mbit/s ATM-1 or 125 Mbit/s FDDI transmission over twisted pair cable.

BRIEF DESCRIPTION OF THE DRAWINGS

The present invention will be further understood from the following description with reference to the drawings in which:

FIG. 1 schematically illustrates a twisted pair transmission arrangement in accordance with an embodiment of the present invention;

FIGS. 2a and 2b graphically illustrate waveforms representative of signals typically transmitted on and received from the twisted pair transmission arrangement of FIG. 1.

Figure 3:
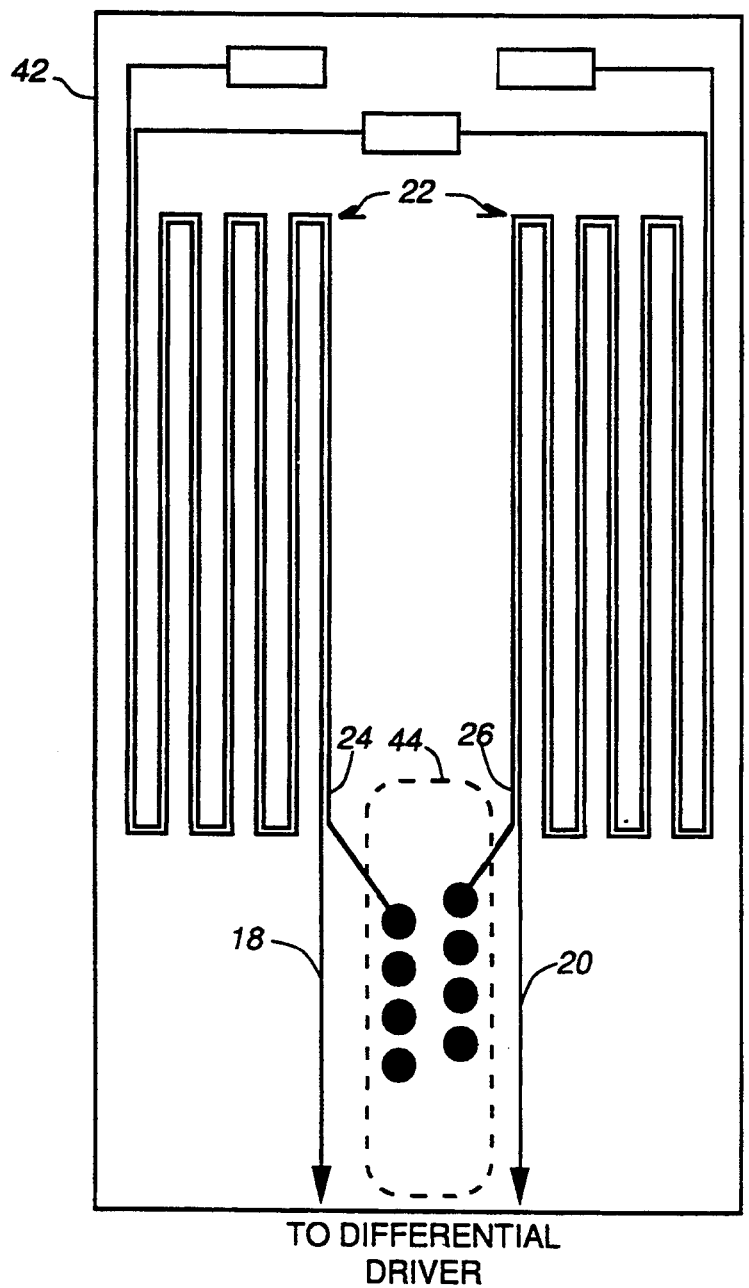
FIG. 3 schematically illustrates a twisted pair cable inductive coupling interface for use in the twisted pair transmission arrangement of FIG. 1 in accordance with a particular embodiment of the present invention.

Similar references are used in different FIGURES to denote similar components.

DETAILED DESCRIPTION

Referring to FIG. 1, there is schematically illustrated a twisted pair transmission arrangement in accordance with an embodiment of the present invention. The twisted pair transmission arrangement includes a pair of differential drivers 10 and 12, a coupling interface 14, and a twisted pair cable 16. The coupling interface 14 includes input tracks 18 and 20 connected to the pair of differential drivers 10 and 12, respectively, and an output track 22 having two branches 24 and 26 connected to the twisted pair cable 16. Tracks 18 and 20 have terminating resistors 28 and 30, respectively, each having a value $R = Z_0$, where $Z_0$ is the characteristic impedance of the respective track. The branches 24 and 26 of output track 22 are coupled by a terminating resistor 32 having a value $R_{term} = Z_{cable}$, where $z_{cable}$ is the characteristic impedance of the twisted pair cable 16. Each input track 18 and 20 parallels a respective branch 24 and 26 of output track 22 for a coupling length $L_C$.

The twisted pair transmission arrangement uses printed circuit board technology. The tracks 18, 20, and 22 can be printed and routed with sufficient accuracy to provide the balance required for differential transmission.

In operation, a NRZ data signal is differentially driven onto the input tracks 18 and 20 by drivers 10 and 12, respectively. The driven signals are inductively and capacitively coupled to respective branches of the output track 22. Waveforms 34 and 36 represent typical differential input signals and waveforms 38 and 40 represent the typical differential coupled output signals.

Referring to FIGS. 2a and 2b, there are graphically illustrated typical coupled differential signals and regenerated differential signals, respectively. A differential 150 MHz NRZ random data signal coupled onto a 25 m unshielded twisted pair cable results in a typical coupled signal of FIG. 2a. Recovering a differential NRZ signal from the twisted pair cable using a comparator provides a typical regenerated differential signal of FIG. 2b. An example of a comparator suitable for recovering the signal is an MC1652 by Motorola.

Referring to FIG. 3, there is schematically illustrated a twisted pair coupling interface in accordance with a particular embodiment of the present invention. For the twisted pair coupling interface, input tracks 18 and 20 and corresponding output track branches 24 and 26 are folded back upon themselves so that the coupling interface 14 occupies a compact area on a printed circuit board 42 adjacent to a connector 44 for the twisted pair cable. The track impedance and the degree of coupling can be adjusted by varying the track width and track separation. Pulse width can be adjusted by varying the coupled length $L_C$.

The embodiments of the invention described and illustrated in FIGS. 1 and 3 use microstrip technology. If striplines are used for both input and output tracks of the coupling interface no termination resistor is required on the output track. Geometry of the input and output tracks can be adjusted to provide a characteristic impedance substantially equivalent to the characteristic impedance of the twisted pair cable.

Numerous modifications, variations and adaptations may be made to the particular embodiments of the invention described above without departing from the scope of the invention, which is defined in the claims.

What is claimed is:

1. An interface for differentially driven twisted pair transmission comprising:

a first track having an input at one end and a first termination resistor at the other;

a second track having an input at one end and a second termination resistor at the other;

a third track having a first branch substantially parallel to and adjacent the first track and a second branch substantially parallel to and adjacent the second track;

a non-inverting driver connected to the input of the first track;

an inverting driver connected to the input of the second track;

the first branch having an output at a near end adjacent to the input of the first track;

the second branch having an output at a near end adjacent to the input of the second track;

first and second branches having far ends connected together via a third termination resistor;

the first and second termination resistors have resistance values substantially equal to a characteristic impedance of the first and second track respectively;

the third termination resistor has a resistance value substantially equal to a characteristic impedance of a twisted pair cable for connection to outputs of first and second branches of the third track; and outputs of first and second branches of the third track are connected to respective wires at a first end of a twisted pair cable, wherein the second end of the twisted pair cable is connected to a comparator.

2. An interface as claimed in claim 1 wherein the first track and first branch and the second track and second branch are formed in a u-shape.

3. An interface as claimed in claim 2 wherein each track and branches are formed as a series of continuous u-shapes within a rectangular area of a printed circuit board.

4. An interface as claimed in claim 3 wherein the printed circuit board includes pads for connection of the third track to a connector.

5. An interface as claimed in claim 4 including a connector mounted on the circuit board with leads connected to the pads for connection to a twisted pair cable via a mating connector.

* * * * *